(12) United States Patent
Pang et al.

(10) Patent No.: US 7,956,649 B1
(45) Date of Patent: Jun. 7, 2011

(54) FREQUENCY PATTERN DETECTOR

(75) Inventors: Simon Pang, San Diego, CA (US); Viet Do, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 12/843,534

(22) Filed: Jul. 26, 2010

(51) Int. Cl.
*H03D 13/00* (2006.01)

(52) U.S. Cl. .......................... 327/42; 327/49

(58) Field of Classification Search ............... 327/39–49
See application file for complete search history.

(56) References Cited

U.S. PATENT DOCUMENTS

| | | | |
|---|---|---|---|
| 6,331,792 B1 * | 12/2001 | Tonietto | 327/48 |
| 7,532,040 B1 * | 5/2009 | Kelkar et al. | 327/48 |
| 7,764,088 B2 * | 7/2010 | Chen et al. | 327/47 |
| 7,786,763 B1 * | 8/2010 | Bal et al. | 327/43 |

* cited by examiner

*Primary Examiner* — Hai L Nguyen
(74) *Attorney, Agent, or Firm* — Law Office of Gerald Maliszewski; Gerald Maliszewski

(57) ABSTRACT

A window sampling system and method are provided for comparing a signal with an unknown frequency to a reference clock. A pattern modulator accepts a compClk signal and supplies a test window with a period equal to n compClk periods, where n is an integer greater than 1. A pattern detector accepts the test window and a reference clock, and contrasts the test window with the reference clock. In response to failing to fit n reference clock periods inside the test window, the pattern detector supplies a frequency pattern detector output signal (fpdOut) indicating that the frequency of the compClk is greater than the reference clock frequency.

15 Claims, 12 Drawing Sheets

FREQUENCY PATTERN DETECTOR

BACKGROUND OF THE INVENTION

1. Field of the Invention

This invention generally relates to phase-locked loop (PLL) circuitry and, more particularly, to a system and method for simply determining the frequency of a signal with respect to a known reference frequency.

2. Description of the Related Art

In many communication applications, the most critical process in determining device performance involves ascertaining the relationship among key frequencies. This complex process limits device performance with regard to speed of acquisition, power consumption, and integrated circuit (IC) die area.

In all PLLs, an internal oscillator is calibrated such that its frequency is exactly identical to an external reference. Modern PLLs consist of an oscillator which can be digitally calibrated. This oscillator is called a digitally calibrated oscillator (DCO). A mechanism is required to identify a digital control value that produces a DCO oscillation with frequency close to the external reference. The mechanism, called frequency band search (FBS), must be simple, such that implementation is cost competitive. Speedy convergence is also highly desirable for fast PLL lock time.

Figure 8:
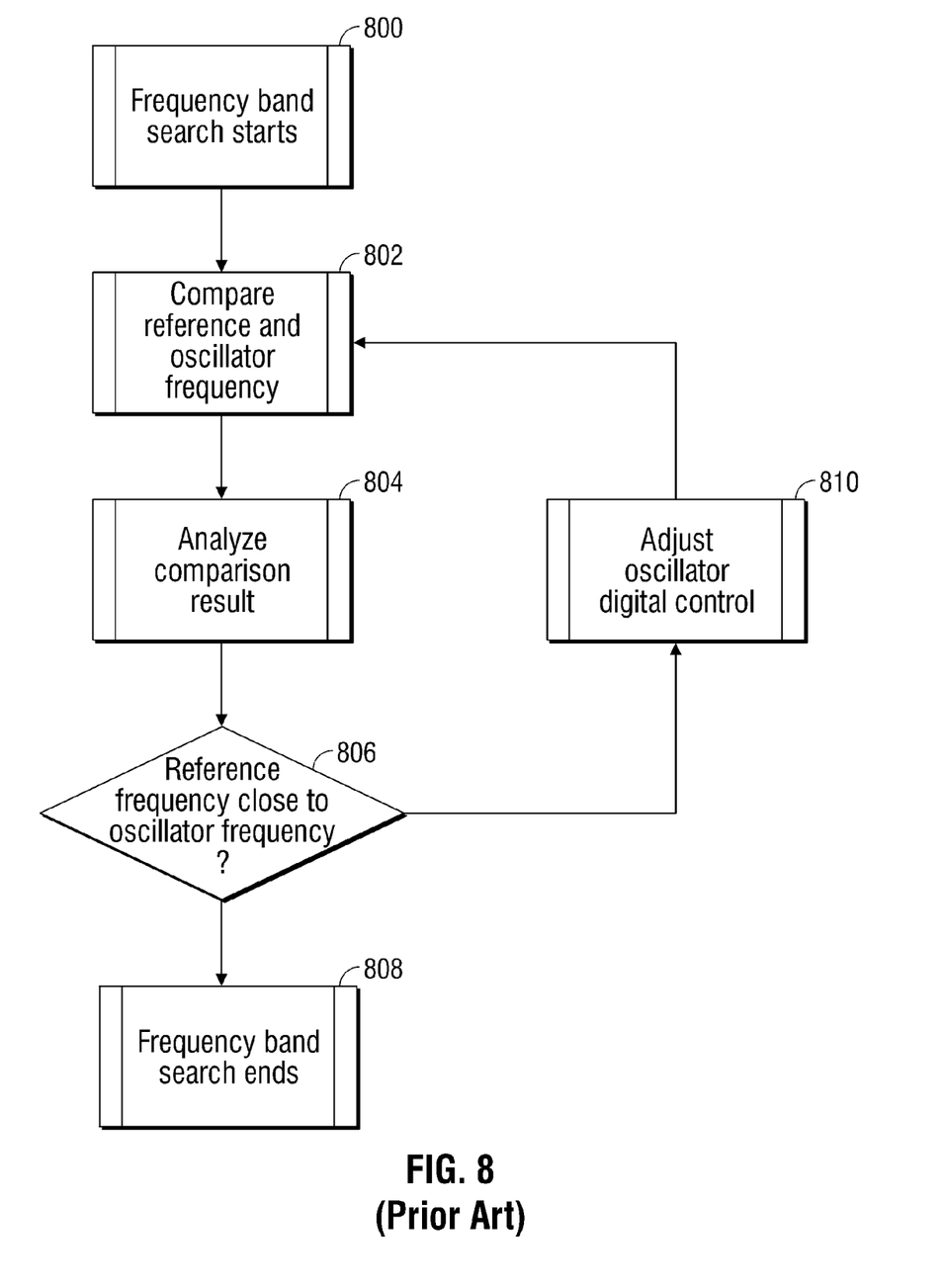
FIG. 8 is a flowchart illustrating a process for acquiring a frequency band in a multi-band communication system (prior art).

FIG. 8 is a flowchart illustrating a process for acquiring a frequency band in a multi-band communication system (prior art). The PLL is ubiquitous in communication systems. Communication devices, e.g., serializer/deserializer (SERDES) devices, that operate over a wide range of frequencies require several PLLs or DCOs.

The frequency band search begins in Step 800. In Step 802 a comparison is performed between the frequency of the reference and a divided-down oscillator frequency. The result is then analyzed in Step 804. If the reference frequency is close enough to the divided-down oscillator frequency, FBS concludes in Step 808. Otherwise, the digital control of the oscillator is adjusted in Step 810 and a comparison is performed again (Step 802). A frequency band search across a band of several oscillators can be very time consuming, especially if the communication frequency is unknown.

Figure 1:
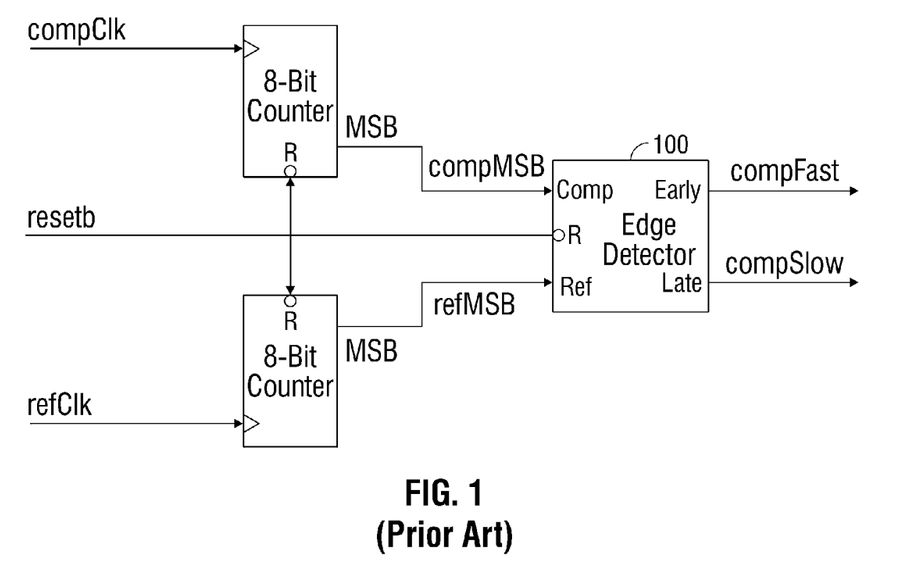
FIG. 1 is a schematic block diagram of a frequency counter (prior art).

FIG. 1 is a schematic block diagram of a frequency counter (prior art). When resetb is released, both counters start to accumulate. The most significant bit (MSB) of each counter rises when the corresponding clock finishes counting $2^7$ clock cycles. If the compClk is faster than refClk in frequency, compMSB rises before refMSB. The Edge Detector 100 identifies the relative time of the rising edge of compMSB and refMSB. CompFast rises if compClk is faster than refClk. However, this method requires a large number of clock cycles to make a comparison, especially if the two clocks are close in frequency. Long measurement times slow PLL frequency acquisition.

It would be advantageous if there was a means of comparing the frequencies of two signals that only required a few clock cycles.

SUMMARY OF THE INVENTION

Disclosed herein is a window sampling pattern means to efficiently compare the frequency between two clock signals. It enables a deterministic mechanism for phase-locked loop (PLL) convergence with a fast lock time. Unlike complex prior arts methods that require counters with many bits to accomplish frequency comparison, the simplest form of the system disclosed herein can be enabled with only 3 flip flops.

The system also reduces the convergence time for a PLL, which is an extremely important requirement in many modern communication devices. The system takes advantage of cycle slipping between the two clocks, making the system 100 times faster than the conventional counter method when the signals being compared are close in frequency.

Accordingly, a window sampling method is provided for comparing a signal with an unknown frequency to a reference clock. A pattern modulator accepts a compClk signal and supplies a test window with a period equal to n compClk periods, where n is an integer greater than 1. A pattern detector accepts the test window and a reference clock, and contrasts the test window with the reference clock. In response to failing to fit n reference clock periods inside the test window, the pattern detector supplies a frequency pattern detector output signal (fpdOut) indicating that the frequency of the compClk is greater than the reference clock frequency.

In one aspect, the test window is modulated with a first polarity (K) of p compClk periods and with a second polarity (B) of x consecutive compClk periods, where x+p=n, as follows:

(K1 ... Kp, B1 ... Bx).

For example, if p and x are 1 (n=2), the test window is the pattern (K1, B1)=(1, 0). If p=1 and x=3 (n=4), the test window is (K1, B1, B2, B3)=(1, 0, 0, 0).

The pattern detector samples the polarity of modulation within the test window with the reference clock. The frequency of the compClk is greater than the reference clock frequency, if one of the following patterns is detected: (K1 ... $K_{(<zp)}$) or (B1 ... $B_{(<zx)}$), where z is equal to the number of reference clock sampling edges. Using the example of p=1 and x=3, the compClk frequency is faster if one of the following patterns is detected. In one pattern, (K1 ... $K_{(<zp)}$), zero is less than zp, and no K modulation periods are sampled, so that what is detected is (0, 0, 0) if the compCLk frequency is slightly higher than the reference clock frequency. In the other pattern, (B1 ... $B_{(<zx)}$), 2 is less than zp, so that if only 2 B modulation periods are sampled, what is detected is (1, 0, 0)—meaning that the compClk frequency is slightly higher than the reference clock frequency.

Additional details of the above-described method and a window sampling system for comparing a signal with an unknown frequency to a reference clock are provided below.

DETAILED DESCRIPTION

Figure 2:
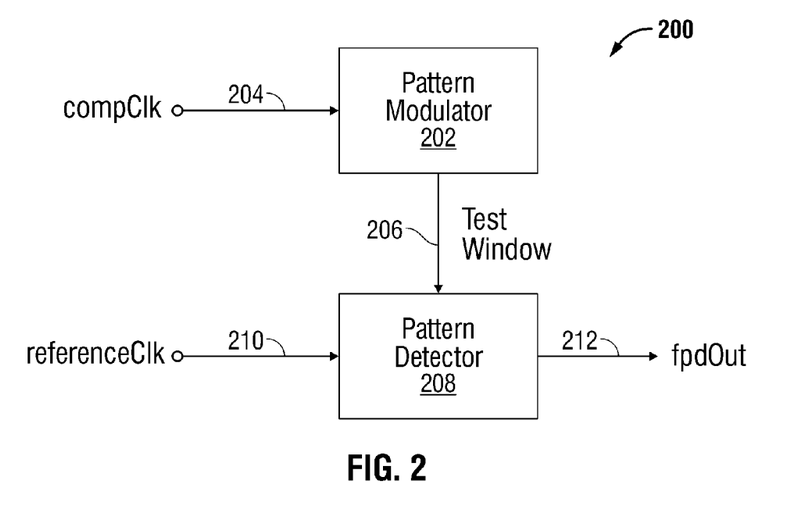
FIG. 2 is a schematic block diagram of a window sampling system for comparing a signal with an unknown frequency to a reference clock.

FIG. 2 is a schematic block diagram of a window sampling system for comparing a signal with an unknown frequency to a reference clock. The system 200 comprises a pattern modulator 202 having an input on line 204 to accept a compClk signal and an output on line 206 to supply a test window. The test window has a period equal to n compClk periods, where n is an integer greater than 1. A pattern detector 208 has an input on line 206 to accept the test window and an input on line 210 to accept a reference clock. The pattern detector 208 contrasts the test window with the reference clock. In response to failing to fit n reference clock periods inside the test window, the pattern detector 208 supplies a frequency pattern detector output signal (fpdOut) on line 212 indicating that the frequency of the compClk is greater than the reference clock frequency.

In one aspect, the pattern modulator 202 supplies a test window having a duty cycle with a first polarity (K) of p compClk periods and with a second polarity (B) of x consecutive compClk periods, where x+p=n, as follows:

(K1 ... Kp, B1 ... Bx).

This pattern means that there are p consecutive K modulation periods followed by x consecutive B modulation periods.

Alternately, the test window may be defined with the following notation:

{Ki, Bj}, where i varies from 1 to p, and j varies from 1 to x.

Figure 3:
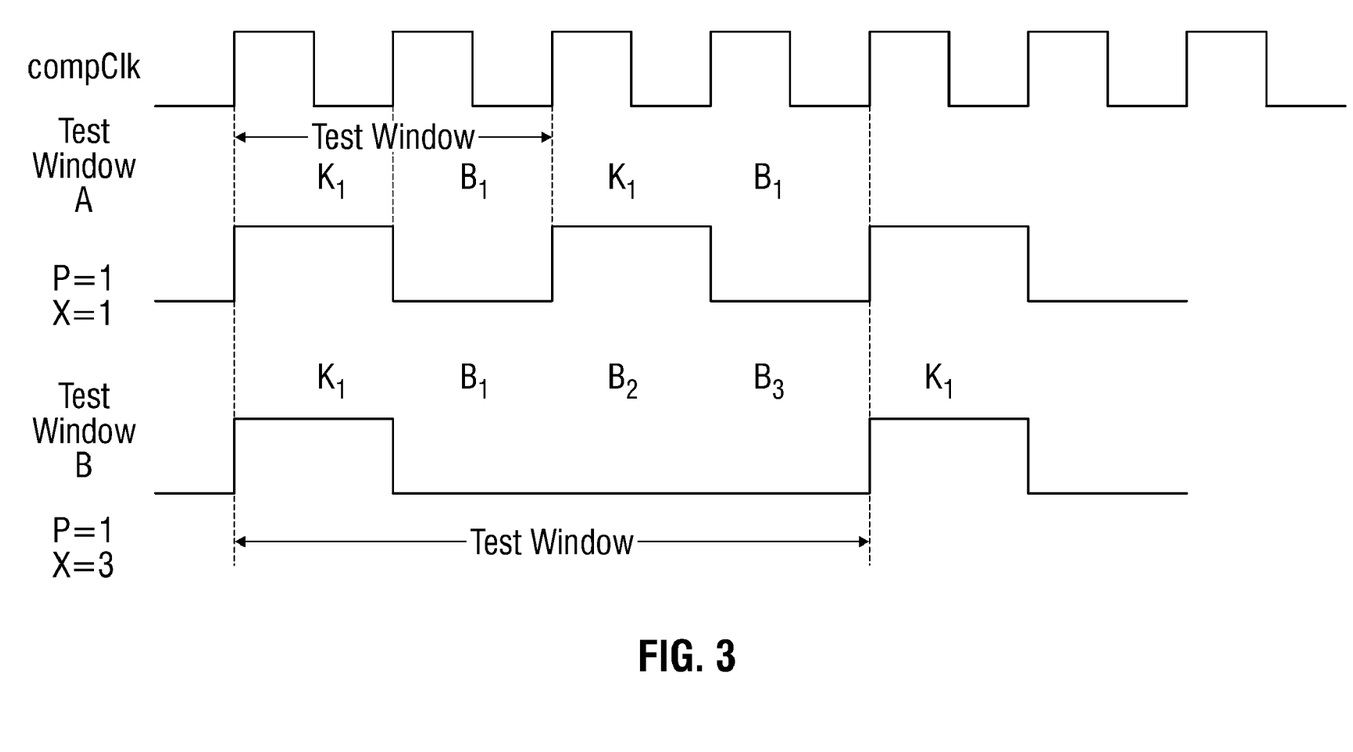
FIG. 3 is a diagram depicting some exemplary test windows.

FIG. 3 is a diagram depicting some exemplary test windows. Test window A is created by setting p=1 and x=1 (n=2), creating the pattern (K1, B1)=(1, 0). Test window B is created by setting p=1 and x=3 (n=4), creating the pattern (K1, B1, B2, B3)=(1, 0, 0, 0). In this example, the K polarity is associated with the high portion of the duty cycle and B is associated with the low portion. However, the high and low polarities may be associated with B and K, respectively, and the order of polarity within the duty cycle may be reversed.

Returning to FIG. 2, the pattern detector contrasts the test window with the reference clock by sampling the polarity of modulations within the test window with the reference clock. In response to detecting a pattern of (K1 ... K$_{(\leq zp)}$) or (B1 ... B$_{(\leq zx)}$), where z is equal to the number of reference clock sampling edges, a fpdOut signal is supplied indicating that the frequency of the compClk is greater than the reference clock frequency. The test window may be sampled with the reference clock rising or falling edge (z=1), or with both edges (z=2).

Alternately, the pattern (K1 ... K$_{(\leq zp)}$) may be represented as follows:

{Ki}, where i varies from 1 to less than zp.

In the case where zp=1, no K modulation periods are sampled. In other words, i=0.

Likewise, the pattern (B1 ... B$_{(\leq zx)}$) may be represented as follows:

{Bj}, where j varies from 1 to less than zx. In the case where zx=1, no B modulation periods are sampled. In other words, j=0.

The pattern (K1 ... K$_{(\leq zp)}$) represents the case where at least a portion of the K cycle of the test window fails to be sampled. If the compClk frequency is close to the reference clock frequency, the B cycle of the test window (B1 ... Bzx) may be fully sampled, even if the K modulation periods are not completely sampled. If the compClk is much faster, the B cycle may or may not be fully sampled.

Likewise, the pattern (B1 ... B$_{(\leq zx)}$) represents the case where at least a portion of the B cycle of the test window fails to be sampled. If the compClk frequency is close to the reference clock frequency, the K cycle of the test window (K1 ... Kzp) may be fully sampled, even if the B modulation periods are not completely sampled. In the compClk is much faster, the K cycle may or may not be fully sampled.

It should be understood that if the reference clock, with a known frequency, is supplied to the pattern modulator on line 202 and the compClk, with an unknown frequency, is supplied on line 210, the system can be used to determine if the compClk frequency is less than the reference clock frequency.

Figure 4:
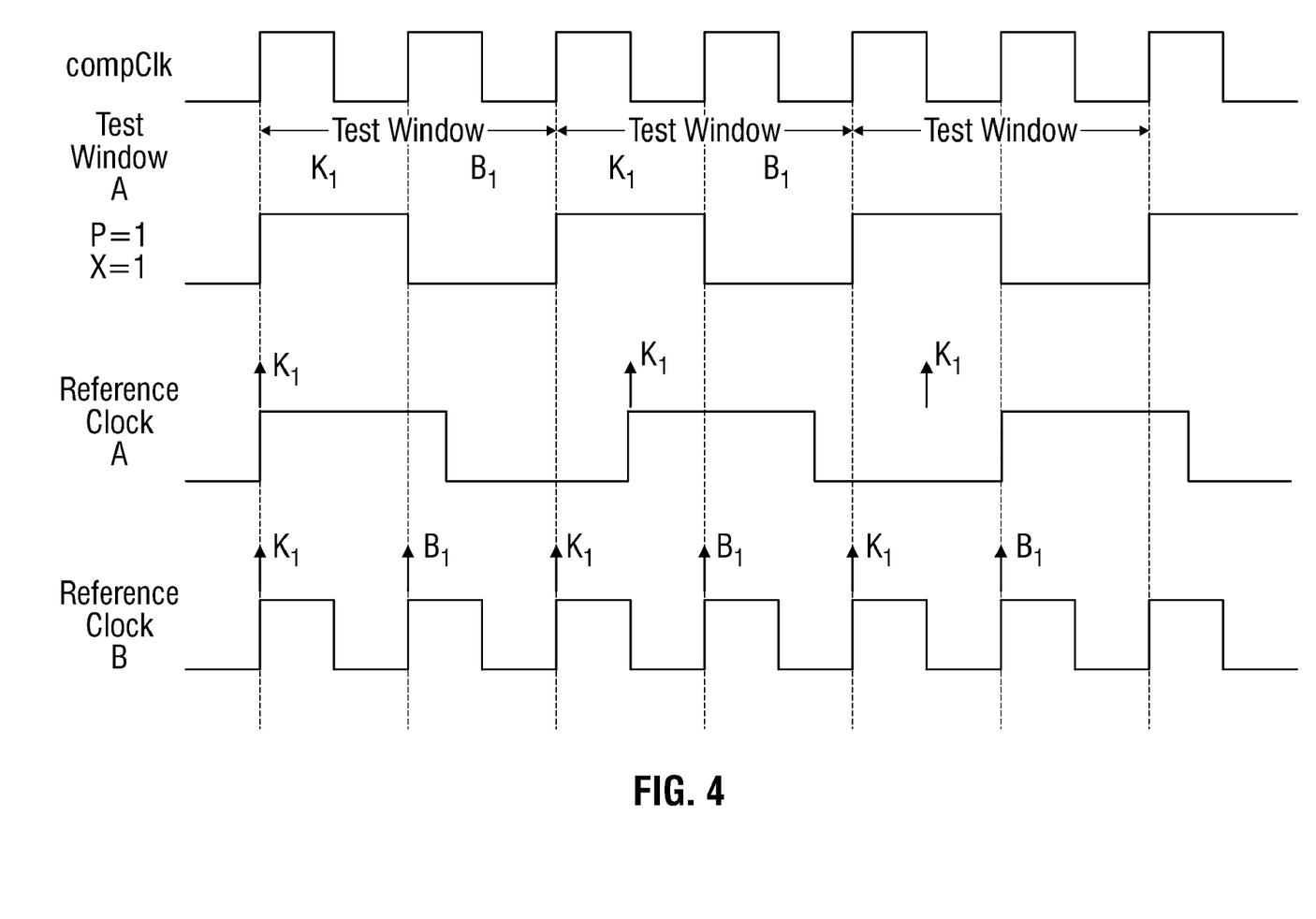
FIG. 4 is a diagram depicting some sampling examples where the compClk frequency is faster than the reference clock.

FIG. 4 is a diagram depicting some sampling examples where the compClk frequency is faster than the reference clock. As in FIG. 3, test window A is creating by setting p=1 and x=1 (n=2), creating the pattern (K1, B1)=(1, 0). The compClk frequency is significantly faster than the frequency of reference clock A, and 3 consecutive patterns of (B1 ... B$_{(zx-1)}$)=(B0) are shown. Since z=1 and x=1, this represents a pattern where the B cycle fails to be sampled in three consecutive test windows. Alternately stated, only the K cycle of the test window (K1) is sampled in the three test windows.

Reference clock B has a frequency equal to the compClk frequency, so that the non-varying pattern of (K1 ... Kzp, B1 ... Bzx) is shown. Since p=1 and x=1, the pattern can also be represented as (K1, B1) in this example.

Figure 5:
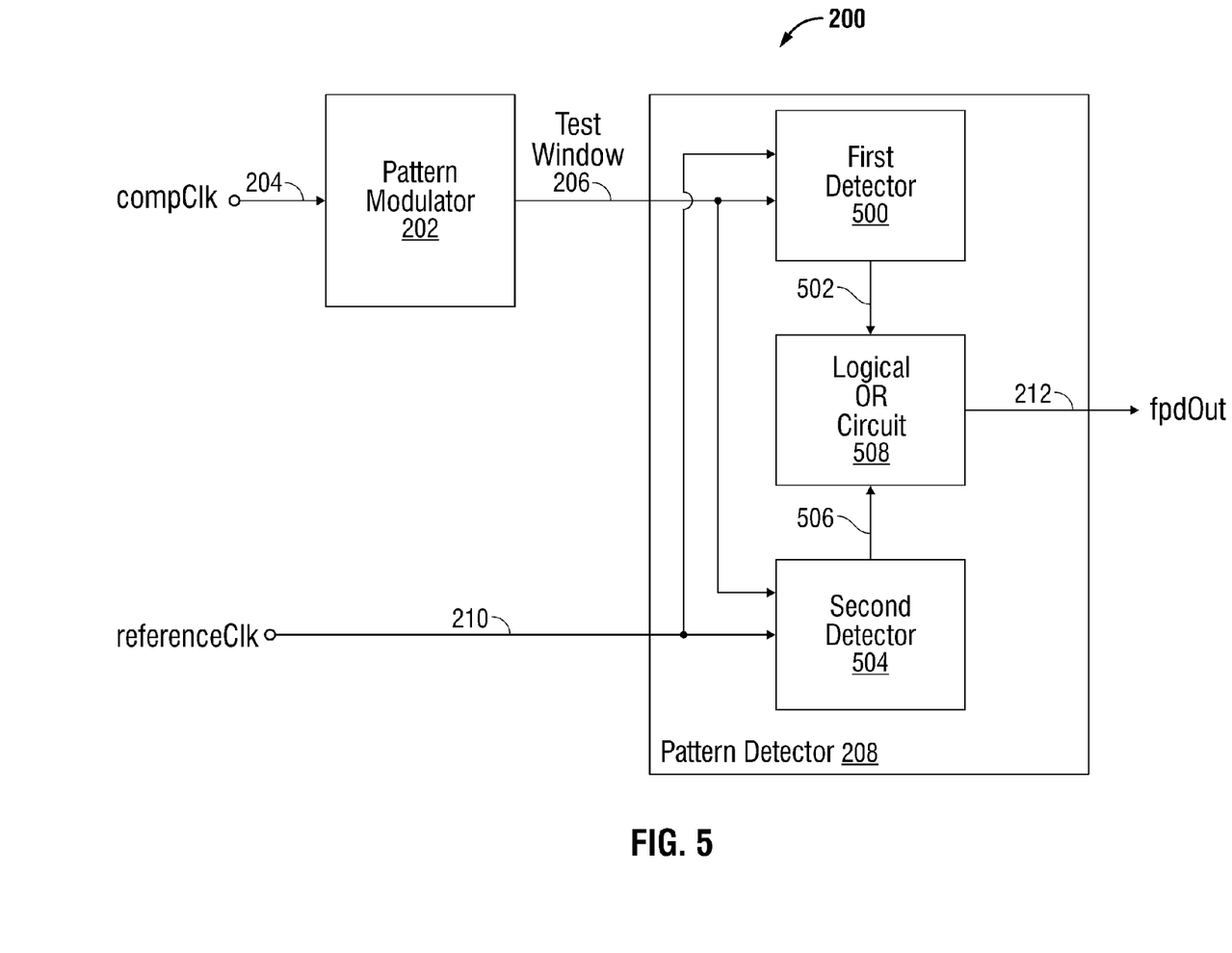
FIG. 5 is a schematic block diagram depicting a first variation of the window sampling system of FIG. 2.

FIG. 5 is a schematic block diagram depicting a first variation of the window sampling system of FIG. 2. In this aspect, pattern detector 208 includes a first detector 500 having an input to accept the test window on 206 and an input on line 210 to accept the reference clock. The first detector 500 samples the polarity of modulation within the test window with an edge of the reference clock with either the rising edge or the falling edge, and in response to detecting the pattern (K1 ... K$_{(\leq zp)}$), supplies a first detector signal on line 502.

A second detector 504 has an input on line 206 to accept the test window and an input on line 210 to accept the reference clock. The second detector 504 samples the polarity of modulation within the test window with one edge of the reference clock, and in response to detecting the pattern (B1 ... B$_{(\leq zx)}$), supplies a second detector signal on line 506. A logical OR circuit 508 has inputs on lines 502 and 506 to accept the first and second detector signals, respectively, and an output on line 212 to supply the fpdOut signal.

Figure 6:
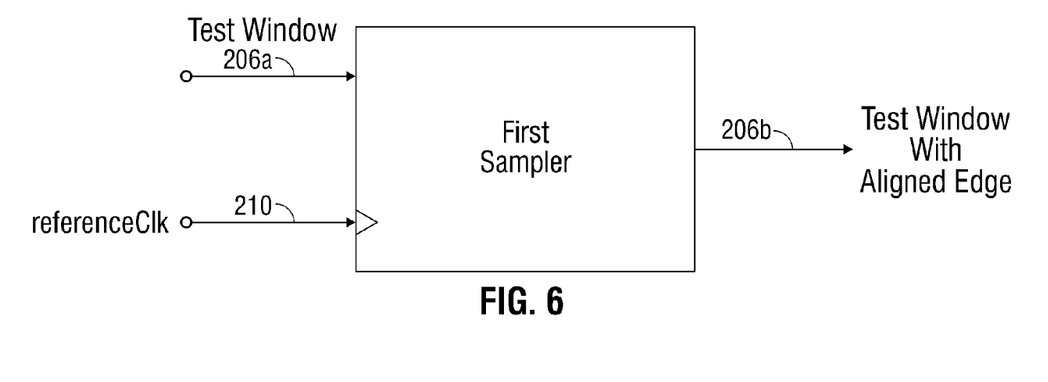
FIG. 6 is a schematic block diagram depicting a second variation of the window sampling system of FIG. 2.

FIG. 6 is a schematic block diagram depicting a second variation of the window sampling system of FIG. 2. In this aspect a first sampler circuit 600 has a signal input on line 206a to accept the test window and a clock input on line 210 to accept the reference clock. The sampler circuit 600 samples the polarity of modulation of the test window with the reference clock rising edge and/or falling edge, and supplies a test window to the pattern detector on line 206b having a an edge aligned with a reference clock edge. In one aspect, the first sampler 600 can be enabled using a latch or flip flop. Note: the first sampler can be implemented with the systems depicted in FIGS. 2, 5, and 7.

Figure 7:
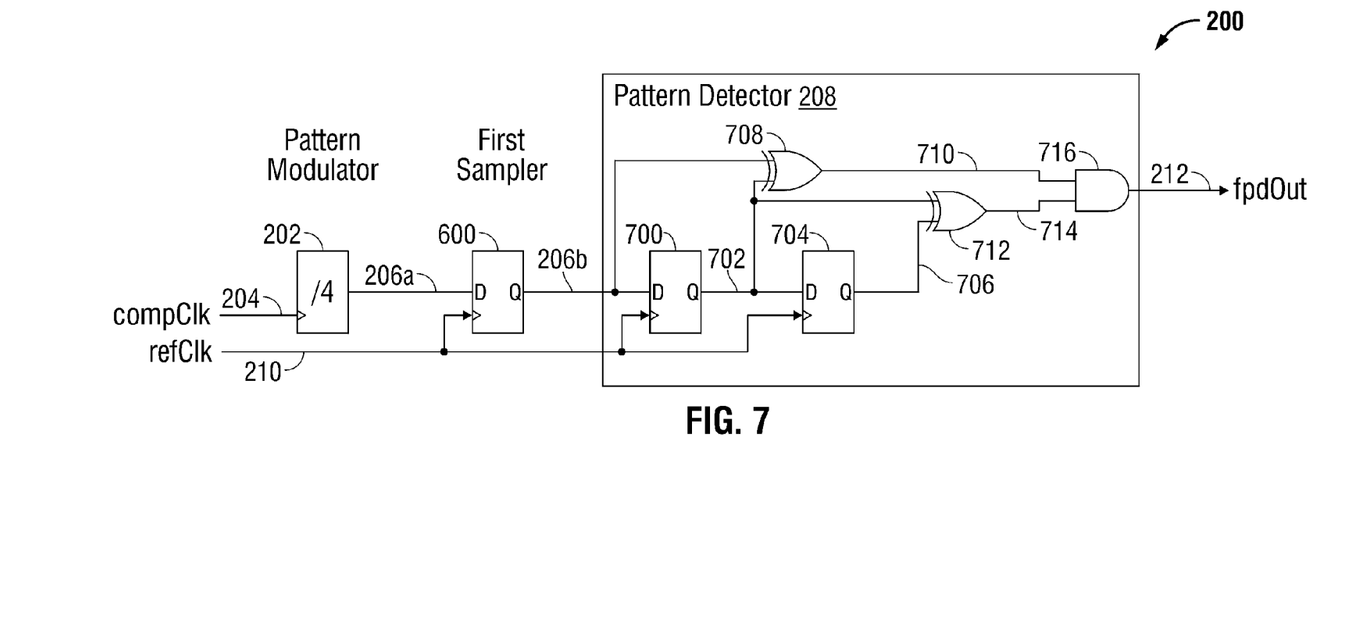
FIG. 7 is a schematic block diagram depicting a third variation of the window sampling system of FIG. 2.

FIG. 7 is a schematic block diagram depicting a third variation of the window sampling system of FIG. 2. In this aspect, the pattern modulator uses values of p=2 and x=2 (n=4). The pattern detector 208 includes a second sampling circuit 700 having a signal input on line 206 to accept the test window and a clock input on line 210 to accept the reference clock. The second sampling circuit 700 samples the polarity of modulation within the test window with one edge (rising or falling) of the reference clock and supplies a first signal at an output on line 702. If the first sampler 600 is used, as shown, the second sampling circuit 700 and first sampler must sample the test window with a common edge of the reference clock.

A third sampling circuit 704 has a signal input on line 702 to accept the first signal and a clock input on line 210 to accept the reference clock. The third sampling circuit 704 samples the polarity of the first signal with one edge of the reference clock, and supplies a second signal at an output on line 706. The third sampling circuit 704 and first sampler 600 must sample the test window with a common edge of the reference clock.

A first exclusive-OR (XOR) gate 708 has inputs on lines 206 and 702 to accept the test window and the first signal, respectively, and an output on line 710 to supply a third signal. A second XOR gate 712 has inputs on lines 702 and 706 to accept the first and second signals, respectively, and an output on line 714 to supply a fourth signal. An AND gate 716 has inputs on lines 710 and 714 to accept the third and fourth signals, respectively, and an output on line 212 to supply the fpdOut signal. Note: the first sampler 600 is shown in this example, but it is not required.

Pattern detector 208 of FIG. 7 may be understood to be a 101/010 pattern detector, as either the pattern 101 or the pattern 010 will cause a pulse on the fpdOut line. The pattern 101 corresponds to the pattern ( . . . K2, B1, K1 . . . ) or (B1 . . . $B_{(<zx)}$)=(B1), where z=1 and x=2. The pattern 010 corresponds to the pattern ( . . . B2, K1, B1 . . . ) or (K1 . . . $K_{(<zp)}$)=(K1), where z=1 and p=2.

Alternately stated, a non-varying detection of the pattern (1, 1, 0, 0) indicates that the reference clock frequency is equal to the compClk, but a pattern of (K1, B1, B2)=(1, 0, 0), which corresponds to a detected pattern of 010, indicates that the compClk frequency is faster because the K cycle of the test window is only sampled once. A pattern of (K1, K2, B1)=(1, 1, 0), which corresponds to a detected pattern of 101, indicating that the compClk frequency is faster because the B cycle of the test window is only sampled once.

Functional Description

Figure 9:
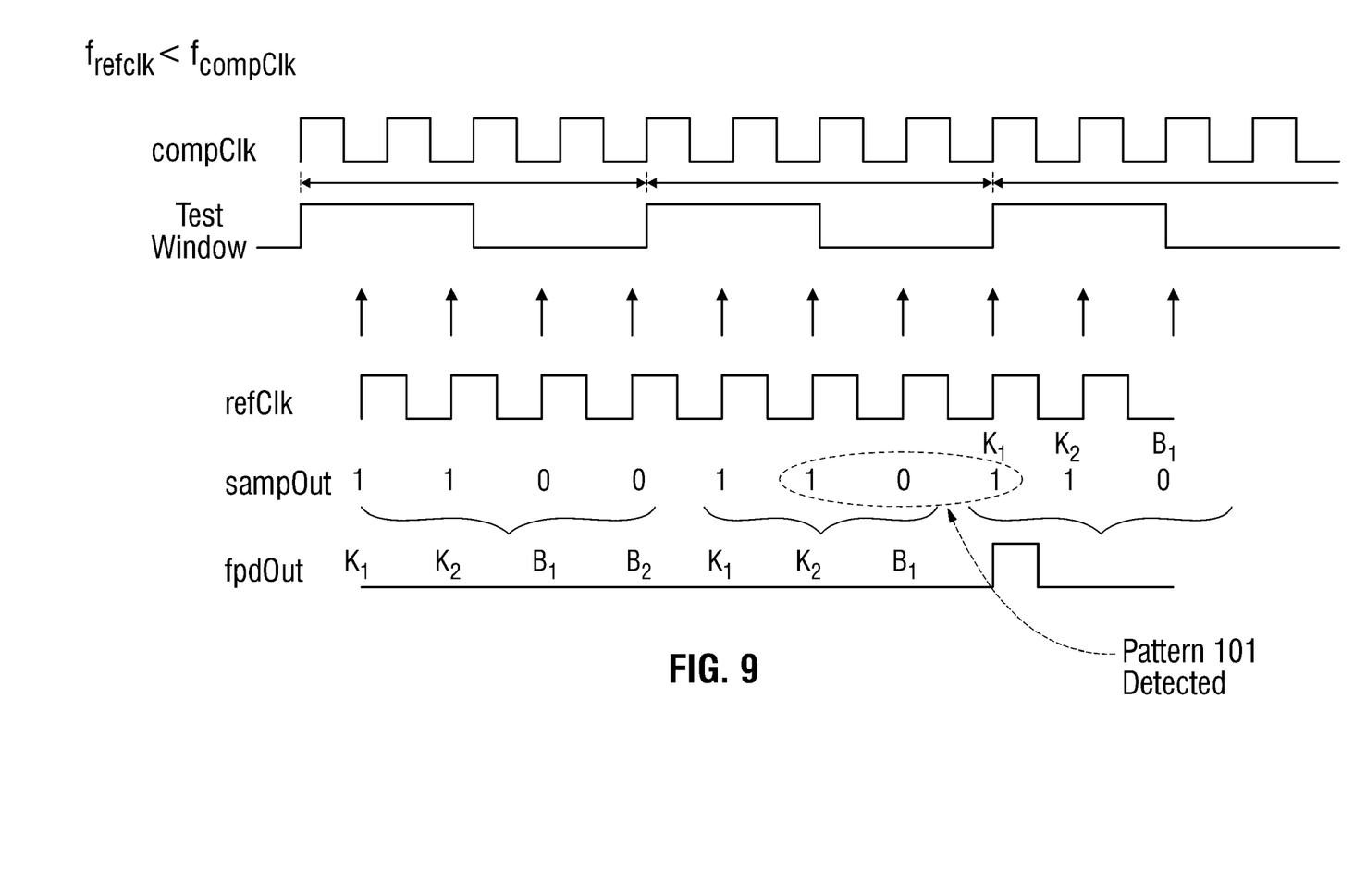
FIG. 9 is a diagram depicting signals associated with the system of FIG. 2, where z=1, n=4, p=2, and x=2.

FIG. 9 is a diagram depicting signals associated with the system of FIG. 7, where z=1, n=4, p=2, and x=2. In this example, the compClk is slightly faster than the reference clock frequency. The 101 pattern is detected, which is associated with pattern (K1, K2, B1) or (B1 . . . $B_{(<zx)}$), as explained in the preceding paragraph.

Figure 10:
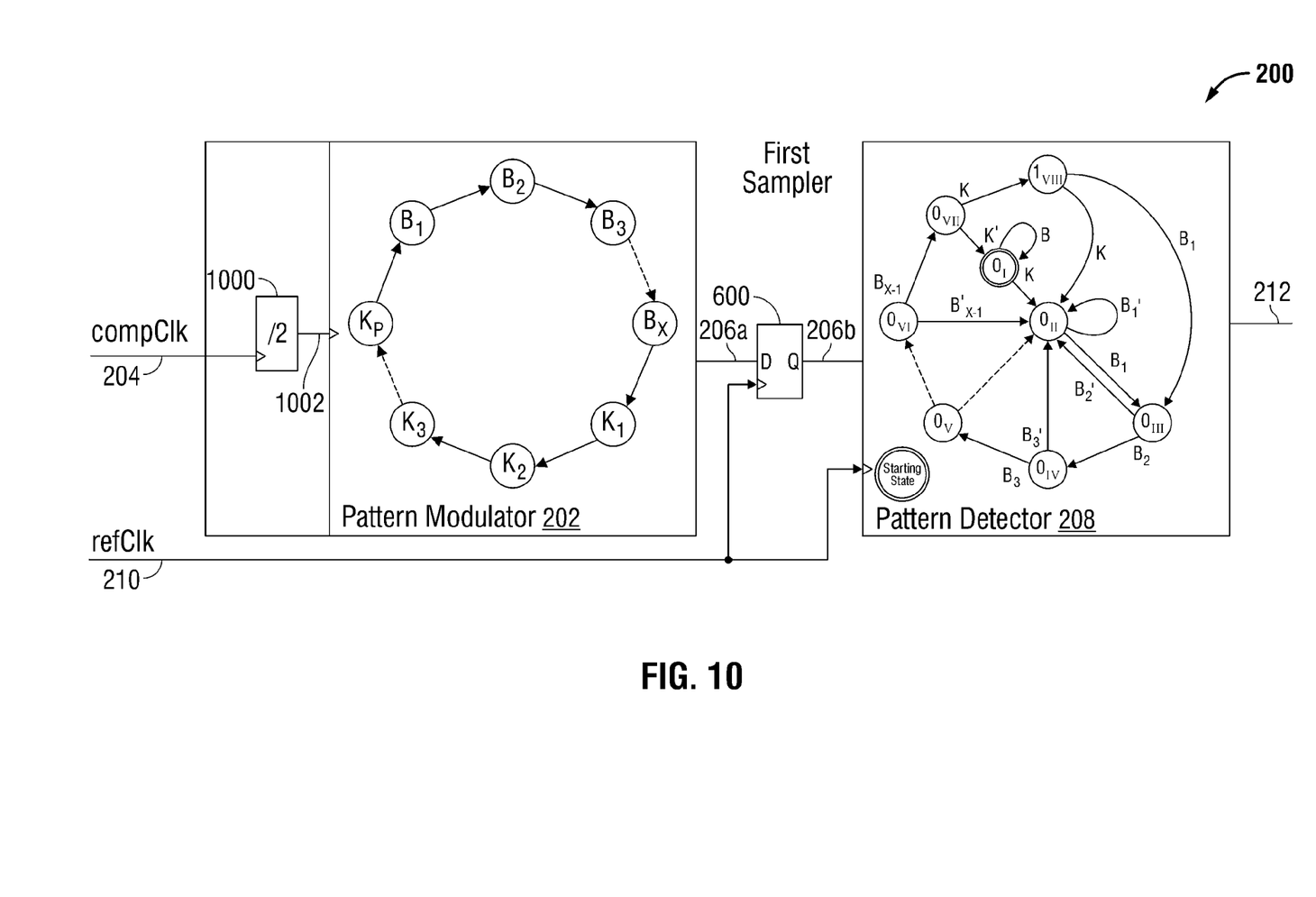
FIG. 10 is a block diagram depicting the window sampling system of FIG. 2 as a state machine.

FIG. 10 is a block diagram depicting the window sampling system of FIG. 2 as a state machine. Generally, n is equal to at least 4, assuming that pattern modulator clock input on 1002 clocks on a single (rising or falling) edge of the divide-by-2 output. A binary pattern of length x+p is periodically generated in pattern modulator 202 and detected in the pattern detector 208. Since the state machine shows p and x values of at least 4, the value of n must be at least 8 in this example. As explained in detail above, the values of x and p just need to satisfy the equation p+x=n. The pattern created by the pattern modulator 202 is defined as $\{K_1, K_p, B_1, B_x\}$ of length x+p bits. The first sampler 600 samples the test window with the refClk. If the pattern detector detects the pattern $\{K, B_1, B_{x-1}, K\}$, for example, fpdOut goes high, indicating that the compClk frequency is faster than the reference clock frequency.

This state diagram has two inputs: a clock and data (test window). It also has one output. Each circle represents a state. For every circle, the 1 or 0 inside denotes the output logic value. For example, the starting state (state I) outputs a zero (low). Edges with direction originate from the circle. The edge is labeled. At every edge of a clock, the input transitions from one state to another state, depending on the logic value of the input. For example, the starting state moves to state II if the input has logic value "K", because the edge is labeled with "K". The starting state moves to state I (itself) if the logic value is NOT(K), which is represented by the symbol K'. The dotted lines denote extensions to accommodate the necessary number of states as the value of x can take on any number. For example, with a value of x=5, the number of circles would be as denoted in the diagram.

For example, in the case when the input is "KBBBBBK", the state transition starts at state I. At the rising edge of a clock, K is received at the input. Therefore, state II becomes the next state. The state transitions will therefore be I, II, III, IV, V, VI, VII and VIII. At state VIII, the output will becomes high.

For the case with input "KBBKBBBBBK", the state transition becomes I, II, III, II, III, IV, V, VI, VII and VIII. The output will not have a logic value high, until the last K is reached. Therefore, the state machine is a pattern detector, such that when the sequence KBBBBBK is received at the input, a logic high appear at the output. Otherwise, the output remains low. In more general terms, the state machine detects for the pattern K, $B_1, B_2 \ldots B_x$, K (in this example). The state machines described below work in an equivalent manner.

Figure 11:
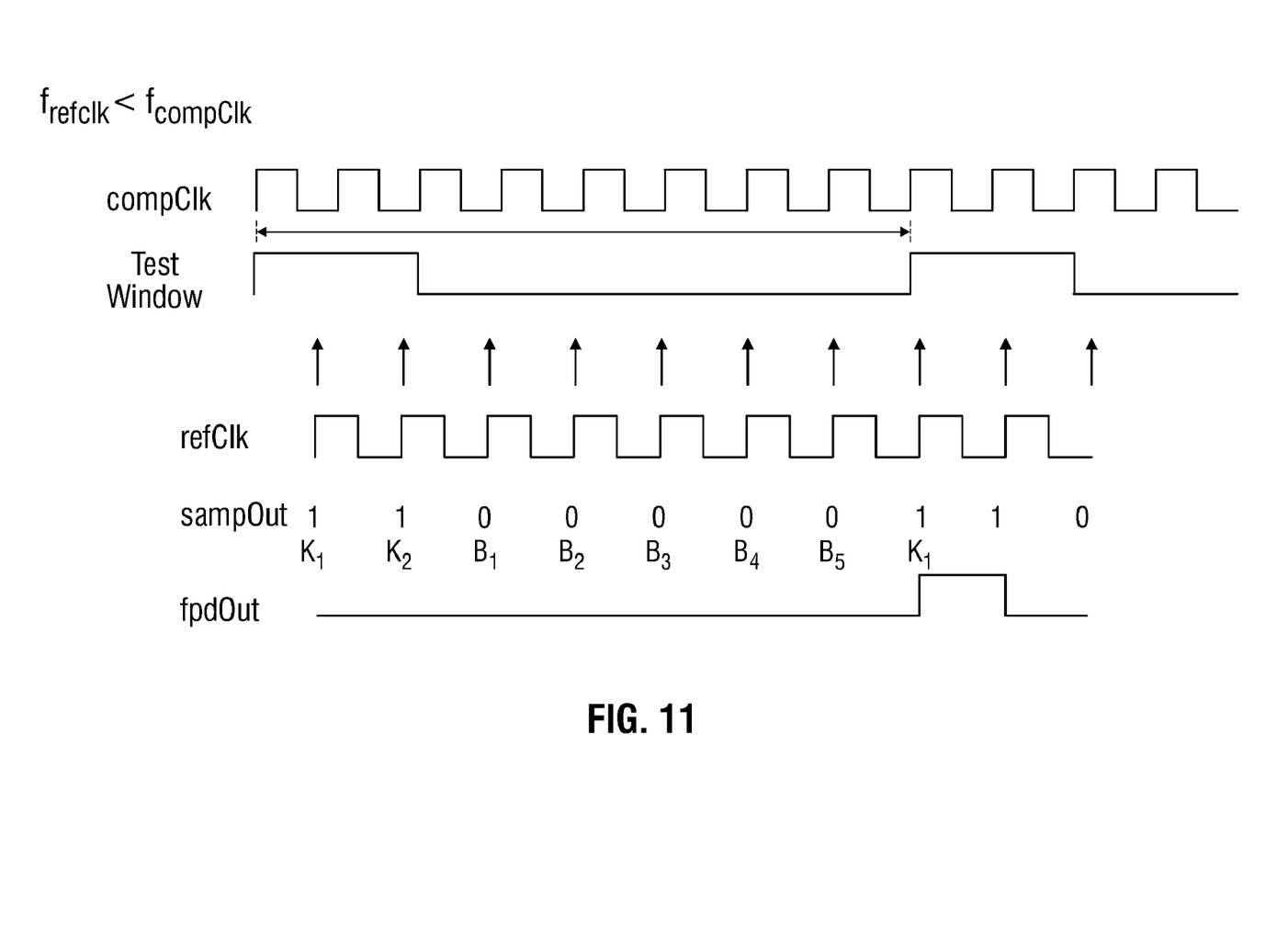
FIG. 11 is a diagram depicting a scenario where the compClk frequency is faster than the reference clock, z=1, p=2, x=6, and n=8.

FIG. 11 is a diagram depicting a scenario where the compClk frequency is faster than the reference clock, z=1, p=2, x=6, and n=8. The pattern (K1, K2, B1, B2, B3 B4, B5) is detected, which corresponds to pattern (B1 . . . $B_{(<zx)}$)= (B1 . . . B5).

Figure 12:
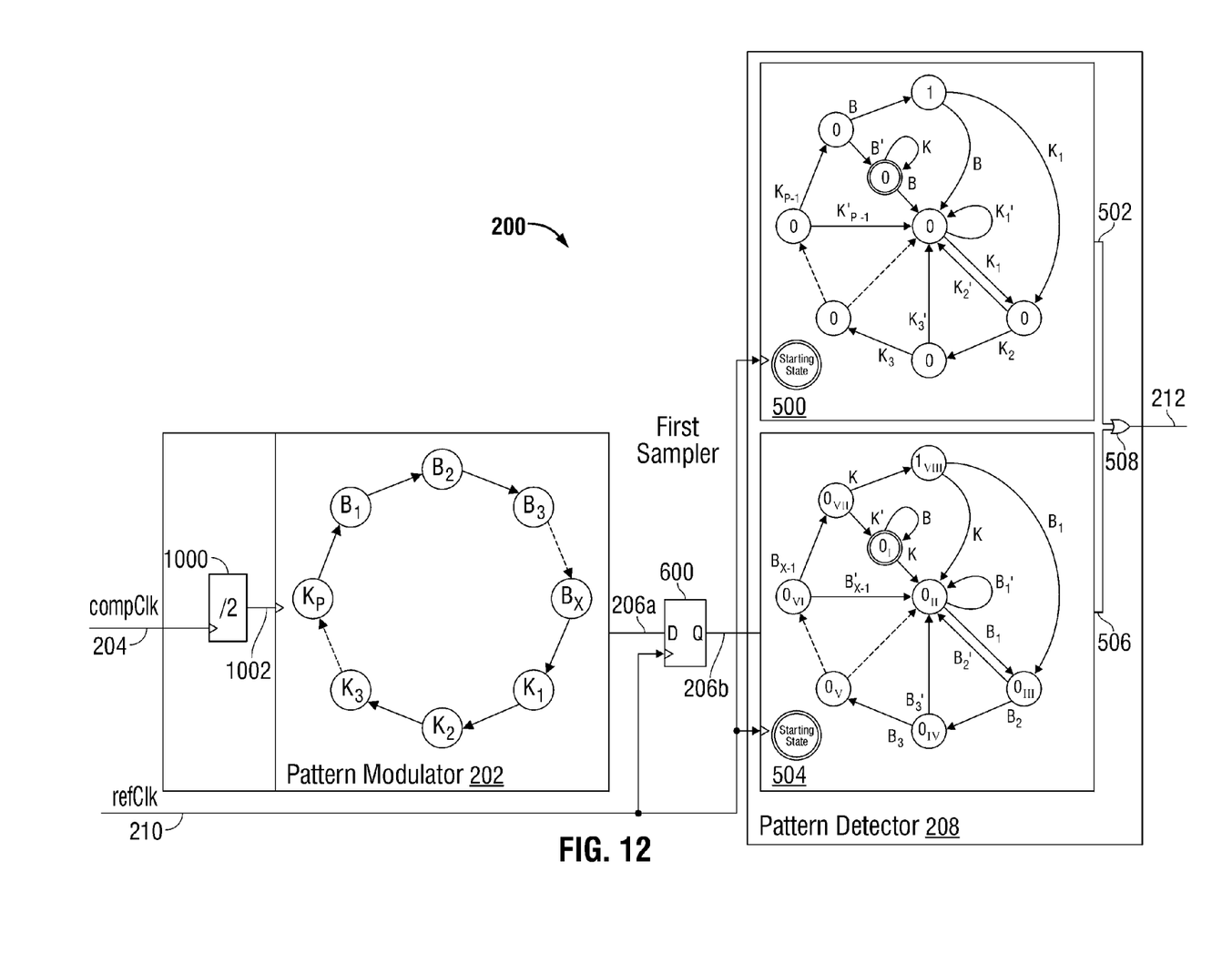
FIG. 12 is a block diagram depicting the system of FIG. 5 enabled as a state machine.

FIG. 12 is a block diagram depicting the system of FIG. 5 enabled as a state machine. Generally, n is equal to at least 4, since it is assumed that the pattern modulator is clocked on only one edge of the divided-by-2 output on line 1002. Since the state machine shows p and x values of at least 4, the value of n must be at least 8 in this example. As explained in detail above, the values of x and p just need to satisfy the equation p+x=n. The pattern modulator generates a test window with the pattern (K1 . . . Kp, B1 . . . Bx). The second sampler 500 searches for the pattern (K1 . . . $K_{(<zp)}$), and the third sampler 504 searches for the pattern (B1 . . . $B_{(<zx)}$), where z=1.

Figure 13:
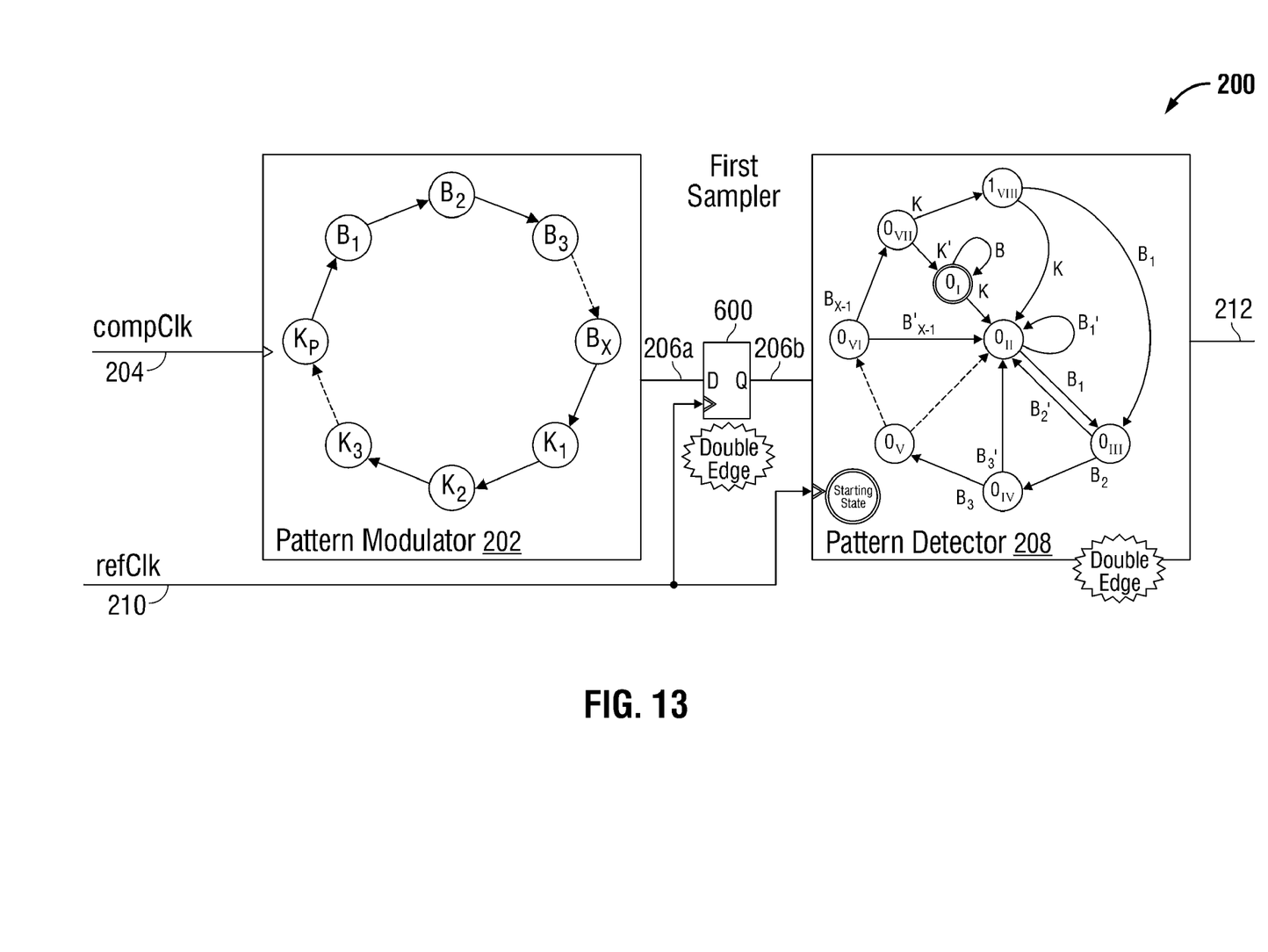
FIG. 13 is a block diagram of window sampling state machine specifically enabled for double-edge triggering.

FIG. 13 is a block diagram of window sampling state machine specifically enabled for double-edge triggering. Generally, n is equal to at least 2, assuming that the compClk signal is clocked on only a single (rising or falling) edge. Since the state machine shows p and x values of at least 4, the value of n must be at least 8 in this example. As explained in detail above, the values of x and p just need to satisfy the equation p+x=n. Both the first sampler 600 and the pattern detector 208 sample with both edges of the reference clock (z=2). The pattern modulator generates a test window with the pattern (K1 . . . Kp, B1 . . . Bx)=(K1, B1 . . . Bx), where p=1. The pattern detector searches for the pattern (K1 . . . $K_{(<zp)}$)= (K0) or (B1 . . . $B_{(<zx)}$).

Figure 14:
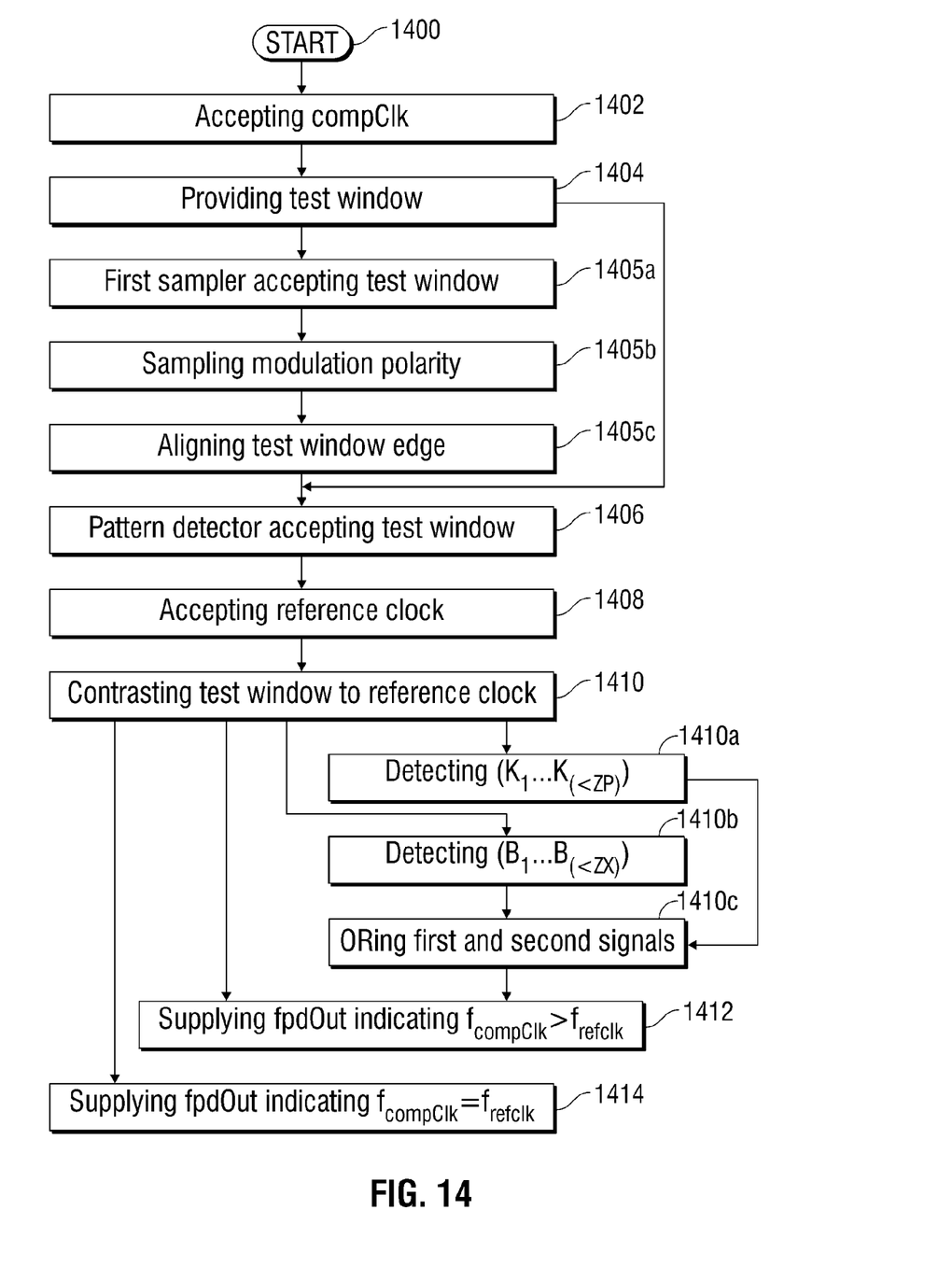
FIG. 14 is a flowchart illustrating a window sampling method for comparing a signal with an unknown frequency to a reference clock.

FIG. 14 is a flowchart illustrating a window sampling method for comparing a signal with an unknown frequency to a reference clock. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 1400.

In Step 1402 a pattern modulator accepts a compClk signal. In Step 1404 the pattern modulator supplies a test window with a period equal to n compClk periods, where n is an integer greater than 1. In Step 1406 a pattern detector accepts the test window, and in Step 1408 the pattern detector accepts a reference clock. In Step 1410 the pattern detector contrasts the test window with the reference clock. In response to failing to fit n reference clock periods inside the test window, Step 1412 supplies a frequency pattern detector output signal (fpdOut) indicating that the frequency of the compClk is greater than the reference clock frequency. Step 1414 supplies a fpdOut signal indicating that the compClk period equals the reference clock period in response to detecting a non-varying pattern of $(K1 \ldots K_{zp}, B1 \ldots B_{zx})$.

In one aspect, supplying the test window in Step 1404 includes supplying the test window modulated with a first polarity (K) of p compClk periods and with a second polarity (B) of x consecutive compClk periods, where x+p=n, as follows:

(K1 ... Kp, B1 ... Bx).

Contrasting the test window with the reference clock in Step 1410 includes sampling the polarity of modulation within the test window with the reference clock, and supplying the fpdOut signal in Step 1412 includes detecting a pattern of $(K1 \ldots K_{(\leq p)})$ or $(B1 \ldots B_{(\leq zx)})$, where z is equal to the number of reference clock sampling edges. The pattern detector may use either one (rising or falling) or two (rising and falling) sampling edges.

In one aspect, sampling the polarity of modulation within the test window in Step 1410 includes substeps. In Step 1410a a first detector samples the polarity of modulation within the test window with either a rising or falling edge, and in response to detecting the pattern $(K1 \ldots K_{(\leq p)})$, supplies a first detector signal. In Step 1410b a second detector samples the polarity of modulation within the test window with one the reference clock edges, and in response to detecting the pattern $(B1 \ldots B_{(\leq zx)})$, supplies a second detector signal. Step 1410 logically OR's the first and second detector signals.

In another aspect, a first sampler circuit accepts the test window in Step 1405a, and the reference clock in Step 1405b. In Step 1405c the first sampler circuit samples the polarity of modulation within the test window with an edge of the reference clock with either the rising or falling edge, and supplies the test window to the pattern detector having an edge aligned with a reference clock edge.

A system and method have been provided for sampling a test window of an unknown frequency to determine the frequency of the clock with respect to a known reference. Particular circuits and process steps have been used to illustrate the invention, but the invention is not necessarily limited to these examples. Other variations and embodiments of the invention will occur to those skilled in the art.

We claim:

1. A window sampling system for comparing a signal with an unknown frequency to a reference clock, the system comprising:
a pattern modulator having an input to accept a compClk signal and an output to supply a test window with a period equal to n compClk periods, where n is an integer greater than 1; and
a pattern detector having an input to accept the test window and an input to accept a reference clock, the pattern detector contrasting the test window with the reference clock, and in response to failing to fit n reference clock periods inside the test window, supplying a frequency pattern detector output signal (fpdOut) indicating that the frequency of the compClk is greater than the reference clock frequency.

2. The system of claim 1 wherein the pattern modulator supplies the test window having a duty cycle with a first polarity (K) of p compClk periods and with a second polarity (B) of x consecutive compClk periods, where x+p=n, as follows:

(K1 ... Kp, B1 ... Bx); and, wherein the pattern detector contrasts the test window with the reference clock by sampling the polarity of modulations within the test window with the reference clock, and in response to detecting a pattern selected from a group consisting of $(K1 \ldots K_{(\leq zp)})$ and $(B1 \ldots B_{(\leq zx)})$, where z is equal to the number of reference clock sampling edges, supplying the frequency pattern detector output signal indicating that the frequency of the compClk is greater than the reference clock frequency.

3. The system of claim 2 wherein z is selected from a group consisting of 1 and 2.

4. The system of claim 2 wherein the pattern detector includes:
a first detector having an input to accept the test window and an input to accept the reference clock, the first detector sampling the polarity of modulation within the test window with an edge of the reference clock selected from a group consisting of the rising edge and the falling edge, and in response to detecting the pattern $(K1 \ldots K_{(\leq zp)})$, supplying a first detector signal;
a second detector having an input to accept the test window and an input to accept the reference clock, the second detector sampling the polarity of modulation within the test window with the selected edge of the reference clock, and in response to detecting the pattern $(B1 \ldots B_{(\leq zx)})$, supplying a second detector signal; and,
a logical OR circuit having inputs to accept the first and second detector signals, and an output to supply the frequency pattern detector output signal.

5. The system of claim 2 wherein the pattern detector samples the polarity of modulation within the test window with an edge of the reference clock selected from a group consisting of the rising edge and the falling edge.

6. The system of claim 2 further comprising:
a first sampler circuit having a signal input to accept the test window and a clock input to accept the reference clock, the sampler circuit sampling the polarity of modulation of the test window with an edge of the reference clock selected from a group consisting of the rising edge and the falling edge, and supplying a test window to the pattern detector having a an edge aligned with a reference clock edge.

7. The system of claim 2 wherein p=2 and x=2;
wherein the pattern detector includes:
a second sampling circuit having a signal input to accept the test window and a clock input to accept the reference clock, the second sampling circuit sampling the polarity of modulation within the test window with an edge of the reference clock selected from a group consisting of the rising edge and the falling edge, and supplying a first signal at an output;
a third sampling circuit having a signal input to accept the first signal and a clock input to accept the reference clock, the third sampling circuit sampling the polarity of the first signal with the selected edge of the reference clock, and supplying a second signal at an output;

a first exclusive-OR (XOR) gate having inputs to accept the test window and the first signal and an output to supply a third signal;

a second XOR gate having inputs to accept the first and second signals and an output to supply a fourth signal; and, an AND gate having inputs to accept the third and fourth signals, and an output to supply the frequency pattern detector output signal.

8. The system of claim 2 wherein the pattern detector supplies the frequency pattern detector output signal indicating that the compClk period equals the reference clock period in response to detecting a non-varying pattern of (K1 ... $K_{zp}$, B1 ... $B_{zx}$).

9. A window sampling method for comparing a signal with an unknown frequency to a reference clock, the method comprising:

a pattern modulator accepting a compClk signal;

the pattern modulator supplying a test window with a period equal to n compClk periods, where n is an integer greater than 1;

a pattern detector accepting the test window;

the pattern detector accepting a reference clock;

the pattern detector contrasting the test window with the reference clock; and, in response to failing to fit n reference clock periods inside the test window, supplying a frequency pattern detector output signal (fpdOut) indicating that the frequency of the compClk is greater than the reference clock frequency.

10. The method of claim 9 wherein supplying the test window includes supplying the test window modulated with a first polarity (K) of p compClk periods and with a second polarity (B) of x consecutive compClk periods, where x+p=n, as follows:

(K1 ... Kp, B1 ... Bx);

wherein contrasting the test window with the reference clock includes sampling the polarity of modulation within the test window with the reference clock; and, wherein supplying the fpdOut signal indicating that the frequency of the compClk is greater than the reference clock frequency, includes detecting a pattern selected from a group consisting of (K1 ... $K_{(<zp)}$) and (B1 ... $B_{(<zx)}$), where z is equal to the number of reference clock sampling edges.

11. The method of claim 10 wherein sampling the polarity of modulation within the test window with the reference clock includes the pattern detector sampling the polarity of the modulation within the test window with a number of sampling edges selected from a group consisting of 1 and 2.

12. The method of claim 10 wherein sampling the polarity of modulation within the test window with the reference clock includes:

a first detector sampling the polarity of modulation within the test window with an edge of the reference clock selected from a group consisting of the rising edge and the falling edge, and in response to detecting the pattern (K1 ... $K_{(<zp)}$), supplying a first detector signal;

a second detector sampling the polarity of modulation within the test window with the selected edge of the reference clock, and in response to detecting the pattern (B1 ... $B_{(<zx)}$), supplying a second detector signal; and, logically OR'ing the first and second detector signals to supply the fpdOut signal.

13. The method of claim 10 wherein sampling the polarity of modulation with the test window with the reference clock includes the pattern detector sampling the polarity of modulation within the test window with an edge of the reference clock selected from a group consisting of the rising edge and the falling edge.

14. The method of claim 10 further comprising:

a first sampler circuit accepting the test window;

the first sampler circuit accepting the reference clock; and, the first sampler circuit sampling the polarity of modulation within the test window with an edge of the reference clock selected from a group consisting of the rising edge and the falling edge, and supplying the test window to the pattern detector having an edge aligned with a reference clock edge.

15. The method of claim 10 further comprising:

in response to detecting a non-varying pattern of (K1 ... $K_{zp}$, B1 ... $B_{zx}$), supplying the frequency pattern detector output signal indicating that the compClk period equals the reference clock period.

* * * * *